United States Patent [19]

Swiatosz

[11] 4,279,292

[45] Jul. 21, 1981

[54] CHARGE COUPLED DEVICE TEMPERATURE GRADIENT AND MOISTURE REGULATOR

[75] Inventor: Edmund Swiatosz, Maitland, Fla.

[73] Assignee: The United States of America as represented by the Secretary of the Navy, Washington, D.C.

[21] Appl. No.: 947,279

[22] Filed: Sep. 29, 1978

[51] Int. Cl.³ .................... F25B 29/00; F28F 7/00; H01L 25/04
[52] U.S. Cl. .................... 165/61; 165/80 A; 357/82
[58] Field of Search ............. 165/32, 61, 80 A, 80 B, 165/80 D; 357/81, 82, 83; 361/381

[56] References Cited

U.S. PATENT DOCUMENTS

| | | | |
|---|---|---|---|
| 2,930,904 | 3/1960 | Fritts | 165/80 A |
| 3,406,753 | 10/1968 | Habdas | 357/87 |
| 3,412,566 | 11/1968 | Townsend et al. | 165/80 B |
| 3,800,190 | 3/1974 | Marek | 357/82 |
| 4,034,469 | 7/1977 | Koopman et al. | 29/628 |
| 4,037,270 | 7/1977 | Ahmann et al. | 357/79 |
| 4,051,509 | 9/1977 | Beriger et al. | |
| 4,120,019 | 10/1978 | Arii et al. | 357/82 |

OTHER PUBLICATIONS

Kerjilian, Q. K. et al., "Heat-Pipe Cooled Stacked Electronic Wafer Package" IBM Technical Disclosure Bullentin, vol. 18, No. 12 May 1976, 3982-3983.

Primary Examiner—Alfred E. Smith
Assistant Examiner—Janice A. Howell
Attorney, Agent, or Firm—Richard S. Sciascia; Robert W. Adams

[57] ABSTRACT

A temperature and moisture regulator for such devices as integrated circuits and the like is disclosed as comprising an insulated mount for the device whose temperature and moisture is to be regulated, a first thermoelectric cooler in effective contact with both a certain substantially central area of said device and one end of an elongated metal heat-sink. A plurality of resilient heat-conductive, thermal feedback fingers are metallurgically bonded at one of the ends thereof to said heat-sink and are urged against a portion of the surface areas of said device at the other ends thereof in predetermined spatial dispositions from but in proximity with the aforesaid central area thereof that is in contact with said first thermoelectric cooler. Hence, both cooled and heated areas occur on various surfaces of said device, the former of which effects the cooling thereof, and the latter of which effects the heating thereof and, thus, the controlling of whatever moisture is caused by the cooling thereof. A second thermoelectric cooler is effectively connected between the other end of said heat-sink and a heat exchanger.

32 Claims, 2 Drawing Figures

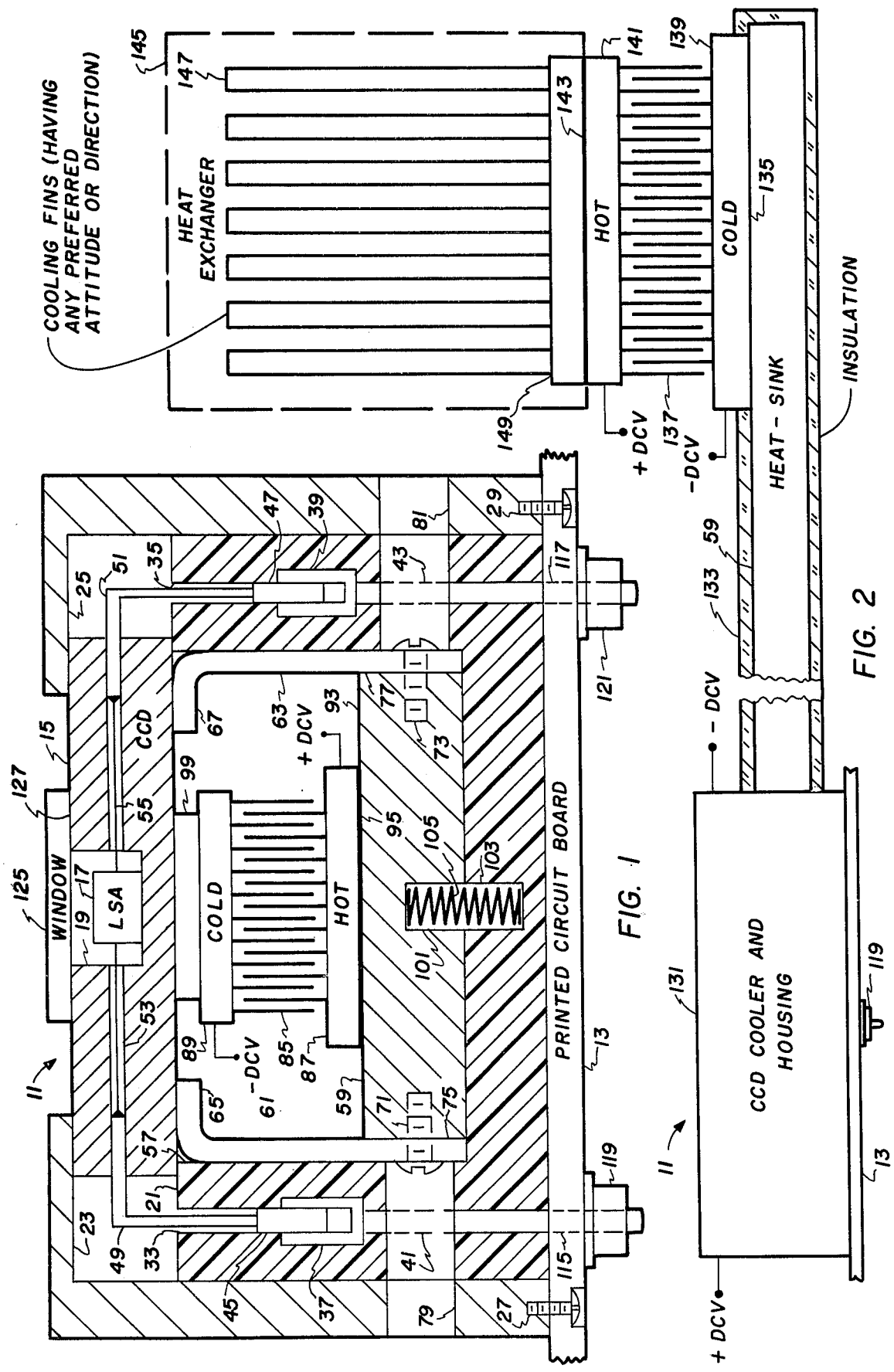

CHARGE COUPLED DEVICE TEMPERATURE GRADIENT AND MOISTURE REGULATOR

FIELD OF THE INVENTION

In general, the present invention relates to cooling and heating systems and, in particular, it pertains to a combination cooling-heating system for semi-conductor, integrated circuit, and other devices, whether pre-packaged or not. In even greater particularity, the subject invention comprises an improved method and means for controlling the temperature and moisture condensate of a charge coupled device (CCD).

DESCRIPTION OF THE PRIOR ART

Because the dissipation of heat from physical objects, electrical circuits, and especially from such devices as semiconductor chips, integrated circuits, and charge coupled devices has been a problem for both industry and the scientific community, numerous types of cooling systems have been devised for controlling the temperature thereof, both from the standpoints of internal design and by regulating the ambient temperature. Such cooling systems are actually too numerous to discuss with real significance; however, it might be well to mention that they seem to run the gamut from simple insulative packaging to elaborate refrigeration systems.

In addition to the above, various and sundry thermal conduction type cooling systems have been invented, as represented by those covered by the following mentioned and discussed patents:

1. U.S. Pat. No. 3,800,190 to Alois Marek for Cooling System for Power Semiconductor Devices, issued Mar. 26, 1974. In the invention covered by this patent, cooling is facilitated in a power semiconductor arrangement by means of thin surface contact layers which, on one side, are in area contact with the current conducting surfaces of a semiconductor body and, on the opposite side, in heat transfer contact with a coolant and in electrical contact with the main terminals. The coolant may be circulated, for example, by the coaction of gravity and convection, or by so-called heat pipe techniques. The contact layers are relatively thin, as previously mentioned, and are made of materials having good electrical and thermal conductivity. Preferably, the main terminals contact said surface contact layers above the semiconductor regions where the smaller part of dissipation energy originates, and the coolant contacts said surface contact layers where the main part of dissipation energy originates during the current conducting state of the semiconductor element.

2. U.S. Pat. No. 4,034,469 to Nicholas George Koopman and Paul Anthony Totta for Method of Making Conduction-Cooled Circuit Package, issued July 12, 1977. The invention covered by this patent includes a circuit package exhibiting a heat transfer path from a semiconductor chip or other heat-generating device to a heat-sink type can or package cover. A heat conducting pad is metallurgically bonded to either said cover or a surface of said heat-generating device, and a heat conducting pad separably attached but metallurgically unbonded to the other. Deformable metal is separately attached to a major surface of the chip to be cooled, so that there is no stress between the chip (or any of its joints) and any attachment solder when the chip generates heat during the electrical operation thereof. The preferred method of fabrication involves the mechanical deforming of a mass of solder against the back side of the chip after the solder has been metallurgically bonded to a heat sink. This process may be accomplished at either high or low temperatures, depending upon the solid composition and the relative strength of the leads which join the chip to conductive supportive substrate.

3. U.S. Pat. No. 4,037,270 to Gerald L. Ahmann et al for Circuit Packaging and Cooling, issued July 19, 1977. The invention covered by this patent includes a circuit board having a plurality of groups of connectors, so disposed and arranged with respect to each other in such manner that each group thereof is capable of receiving a chip carrier. A fluid conduit, carrying a coolant, extends through each group, so that when the contacts of the chip carrier are assembled as a group of connectors, any circuit chip having a heat dissipating bar that is carried thereby is in contact with said conduit. Conductors on each chip make electrical contacts with the contacts on the chip carrier. A clip fastener is fastened to the carrier and includes means to bias the chip mounted thereon, so that electrical connections are established between the chip contacts and the carrier contacts, and thermal connection is established between the heat dissipating bar and the aforesaid conduit.

4. U.S. Pat. No. 4,051,509 to Conrad Beriger et al for Apparatus for Cooling Electrical Devices at Different Electrical Potentials by Means of a Flowing Medium, issued Sept. 27, 1977. The invention covered by this patent includes an apparatus for cooling electrical devices which are at different electrical potentials by means of water or other flowing fluid medium.

SUMMARY OF THE INVENTION

Although the aforesaid prior art devices undoubtedly work quite well for their respective intended purposes, they appear to leave something to be desired from the efficiency and utility standpoints. Accordingly, the subject invention ostensively constitutes an advancement in the state of the art.

Very briefly, the invention uses two stages of cooling, each of which includes a thermoelectric cooler, the first of which pumps heat generated by the device to be cooled into the second, which also may include a finned heat exchanger. The finned heat exchanger may be located some distance away from the device to be cooled—say, a CCD—which is being maintained at a certain temperature gradient condition. The temperature gradient condition of the device to be cooled is accomplished by localized cooling thereof in a small area where the integrated circuitry—that is, the light sensitive area (LSA) is located by a miniature thermoelectric cooler. At the same time, heating of the outer edges thereof is provided by several heat conducting spring-like fingers which recycle or feedback some of the heat from a copper thermal conductor heat-sink which, in turn, is being cooled by another thermoelectric cooler operating in cooperation with the aforesaid finned heat exchanger. Hence, the device to be cooled is, in fact, both cooled and heated at the same time—the former in the center, and the latter adjacent to the periphery—in such manner as to effect such temperature gradients as will both cool it to an optimum operating temperature while preventing the condensation of moisture thereon due to the cooling process. Hence, as just suggested, performance of a charge coupled or other device may be enhanced considerably, depending on whatever design limitations would be effected by such parameters as size, materials used, ambient environment, intended use, other apparatus associated therewith, and the like.

Therefore, an object of paramount importance of this invention is to provide an improved charge coupled device temperature gradient regulator.

Another object of this invention is to provide an improved method and means for reducing the inherent noise of solid state electronic components.

Another object of this invention is to provide an improved method and means for selectively controlling both the temperature and destructive surface moisture of integrated circuitry, semiconductor chips, charge coupled devices, and any and all other apparatus compatible therewith.

A further object of this invention is to provide a relatively compact cooling and/or heating system for electronic and other devices, thereby increasing the useful life thereof.

Still another object of this invention is to provide an improved method and means for packaging charge coupled and other electronic devices in an exceedingly useful manner.

Another object of this invention is to provide a method and means for effecting the heating, cooling, temperature gradient controlling, and moisture controlling of charge coupled and other powered devices with improved heat transfer efficiencies.

Another object of this invention is to provide an improved method and means for increasing the operational performance, accuracies, signal-to-noise ratios, and the like of charge coupled devices, semiconductors, silicon chips, transistors, and other solid state devices.

Another object of this invention is to provide a temperature-temperature gradient-moisture controller for charge coupled and light sensitive devices that is easily and economically constructed, operated, and maintained, and which, in addition, is small, light in weight, and readily portable.

Other objects, advantages and novel features of the invention will become apparent from the following detailed description when considered in conjunction with the accompanying drawing wherein:

BRIEF DESCRIPTION OF THE DRAWING

FIG. 1 discloses a detailed elevational view, partly in cross-section and partly not, of charge coupled device cooler and housing or encasement portion of the instant invention;

FIG. 2 illustrates a side elevational representation of the portion thereof depicted in FIG. 1 in useful combination with the heat-sink, thermoelectric cooler, and finned heat exchanger sub-systems of the overall temperature regulator constituting this invention.

DESCRIPTION OF THE PREFERRED EMBODIMENT

Referring now to FIG. 1, there is shown a charge coupled device cooler and housing portion 11 of the invention as being mounted on any suitable printed circuit board 13. Incorporated therein is charge coupled device (CCD) 15 having a light sensitive element (LSE) 17 mounted in a conventional manner in a predetermined slot 19 therein. It may, for example, be an integrated circuit, photosensitive semiconductor, Fairchild CCD-131 type charge coupled device, if so desired.

Charge coupled device (CCD) 15 is, in turn, mounted in such manner on the open end of an elongated, cup-shaped insulator 21, the latter of which is preferably made of an apoxy or other plastic electrically and thermally insulative type material. CCD 15 is preferably of aluminum oxide or some such semi-heat conducting material, although it may be of any desired material. It is also clamped in place on insulator 21 by a pair of L-shaped clamps 23 and 25 that are effectively connected to the aforesaid printed circuit board 13, as by screws 27 and 29, or any other convenient, conventional means.

Said cup-shaped insulator 21 contains a pair of holes 33 and 35 therethrough, in which are disposed a pair of electrical sockets 37 and 39, to the ends of which a pair of prongs 41 and 43 are electrically connected, respectively. Said holes, sockets, and prongs may be placed within cup-shaped insulator 21 during the manufacture thereof if so desired, thereby permanently containing and retaining them therein. In the alternative said holes, sockets, and prongs may be sized such that they would be compatible with associated structure and removable, as warranted by operational circumstances. Obviously, it would be well within the purview of the artisan having the benefit of the teachings presented herewith to select and size holes 33 and 35, sockets 37 and 39, and prongs 41 and 43, so as to facilitate their optimum manufacture and assembly.

A pair of electrical plugs 45 and 47 are slidably and removably inserted in electrical sockets 37 and 39 in such manner that firm physical and electrical contacts are made therebetween, respectively; and connected between said plugs 45 and 47 are a pair of electrically conductive strips 49 and 51 which are held in position within CCD 15 in a mechanically fixed manner, but with the ends thereof that are opposite the ends connected to prongs 41 and 43 being respectively connected to the terminals of light sensitive apparatus 17 by means of a pair of electrical wires 53 and 55.

Because, as previously mentioned, insulator 21 is cup-shaped, it has a relatively large slot 57 extending along at least part of the length thereof (the ends thereof may be insulated, too, but are not shown), and seated in the bottom thereof (as shown in the attitude of FIG. 1) is a heat-sink 59 that may be made of any suitable heat conductive material—such as, copper, aluminum, or any other metal—but which, in this particular case, is preferably made of copper, since it is a good, readily available, economical, thermal conductor.

Disposed between the inside wall surfaces of cup-shaped insulator 21 and the respective sides of heat-sink 59 are a pair of angled, spring-loaded, heat-conducting, metallic fingers 61 and 63. The angled ends 65 and 67 thereof are of such resilience that they are firmly held in bending tension against a certain lower surface area of CCD 51 and in substantially contiguous disposition with the outer edges thereof. Thus, the interface between the bottom surface of CCD 15 and the top surfaces of finger angles 65 and 67 provides a good heat conducting contact thereat. Fingers 61 and 63 may be connected in any conventional way to the sides of heat-sink 59—say, for example, by screws 71 and 73; however, in order to optimize the thermal conductivity therebetween, it is preferable that they be thermally bonded, too, as, for instance, by thermal-metallurgical bonds 75 and 77, respectively.

The access to screws 71 and 73 may optionally be by means of a pair of holes 79 and 81; on the other hand, the aforesaid screws 71 and 73 may be inserted during manufacture of the invention, thereby obviating the necessity of access holes 79 and 81.

A thermoelectric cooler 85 having a hot junction 87 and a cold junction 89 is mounted in contact with the aforesaid heat-sink 59 in such manner that hot junction 89 is in thermal contact with a predetermined (in this case, substantially centrally located) portion of the upper surface 93 thereof. To provide optimum heat transfer efficiency between the contacting surfaces of said hot junction 87 and surface 93, a metallurgical thermal bonding 95 of any type appropriate to the contacting surface thereof may be employed.

Thermoelectric cooler 85 is, in actuality, a rather sophisticated thermocouple or thermopile; therefore, it inherently includes hot and cold junctions 87 and 89 therein. Nevertheless, since it is a rather key component of the instant invention, it has been found that the temperature difference between said hot and cold junctions can be maximized in the case by using the thermoelectric device known as model MI-1022, manufactured by Marlo Industries, Inc., of Garland, Tex. Accordingly, although any suitable thermocouple or thermopile may be used as thermoelectric cooler 85 due to their inherent hot and cold junction characteristics, it has been found that the pre-manufactured version thereof manufactured by Marlo Industries, Inc., works very well.

Disposed between cold junction 89 of thermoelectric cooler 85 is a thermal conductive gasket 99, the latter of which is preferably made of a suitable metal, but may be any desired material, such as, for instance, a thermally conductive grease, or the like.

In order to insure the firm fitting of the aforementioned assembled components in respective thermal contacts, a hole 101 is located in the lower side of heat-sink 59 and another hole 103 is located in the upper side of slot 57 of insulator 21 which is in alignment with hole 101. Any suitable resilient means, such as, for instance, a coil spring 105, is inserted in compression within holes 101 and 103, so as to urge thermoelectric cooler 85 and gasket 99 into the best heat conductive contact with each other and with the surfaces of CCD 15 and heat-sink 59, respectively, regardless of the movement or jarring of the entire invention due to operational circumstances, or abrasive wear therebetween.

For electrical energization purposes, the aforementioned thermoelectric cooler 85 is electrically connected between the positive and negative terminals of any appropriate direct current voltage power supply (not shown).

If so desired, and without limitation, the space of slot 57 surrounding thermoelectric cooler 85 and gasket 99 may be filled with any suitable silicone or other potting material 109 that would make it rugged, shock resistant, etc., and, thus would facilitate using the subject invention within any ambient environmental medium, including a relatively hostile environmental medium, such as, say, within water, in outer space, within the earth or the earth's atmosphere, or any other predetermined place.

Since printed circuit board 13 may be of any conventional type, the aforementioned prongs 41 and 43 may respectively extend through holes 115 and 117 therein and slidably or otherwise—say, as by solder, or the like—be connected to appropriate electrical connectors or lugs 119 and 121 conventionally mounted on the underside thereof.

Furthermore, as is usually conventional in the CCD packaging art, a glass or plastic window 125 may be used to cover the aforesaid light sensitive apparatus (LSA) 17, and for such purpose, it is preferably sealed or bonded to CCD 15 by means of any suitable adhesive 127.

It would perhaps be noteworthy that the respective junctions and physical or mechanical contacts of all of the components of this invention may be sealed or metallurgically bonded to each other, respectively, in whatever manner will optimize it for its intended use, without violating the spirit or scope thereof.

Of course, that portion or stage of the invention shown in FIG. 1 may be disposed in any properly designed container or housing 131 (see FIG. 2) that will protect it from its ambient environment or facilitate its being mounted as desired.

Referring again to FIG. 2, the above discussed CCD cooler and housing is depicted as being in conjunction with another important cooling apparatus that acts in unique cooperation therewith, in order to optimize the cooling and/or temperature control thereof. As may readily be seen therein, heat-sink 59 extends out of CCD cooler 11 and housing 131 and, thus, may be as short or as long as necessitated by apparatus conditions and operational circumstances. To the extent said heat-sink 59 is exposed to the ambient environment, it is preferably insulated by any suitable conventional thermal insulation material 133 that is adequate or optimum for its particular disposition and length.

Attached to heat-sink 59, as by metallurgical or other conventional thermal bond 135, is a thermoelectric cooler 137 having a cold junction 139 and a hot junction 141, the cold junction of which is the one that is bonded or otherwise attached to said heat-sink 59. And connected to hot junction 141 of thermoelectric cooler 137—as by metallurgical bond 143 or other conventional means—is a heat exchanger 145, preferably having cooling fins 147 mounted on a metal or other heat-conducting base 149, which, of course, is the part of heat exchanger 145 that is actually bonded to hot junction 141 of thermoelectric cooler 137. In this particular case, finned heat exchanger 45 is used not by way of limitation but by way of representation, inasmuch as any heat exchanger warranted by operational circumstances may be substituted therefor.

Although discussed more fully subsequently during the explanation of the operation of the subject invention, it would appear to be noteworthy at this time that in the above mentioned embodiment of the invention, the primary intent is to effect the proper and desired cooling of CCD 15. Thus, thermoelectric coolers 85 and 137 were disposed with their respective hot and cold junctions as shown. However, the reverse situation is true, too, and if it is desired to heat CCD 15, said thermoelectric cooler junctions may be reversed for such purpose. Obviously, one skilled in the art having the teachings given herewith could make whatever design choices would have to be made to reverse the heat flow to and through and from thermoelectric coolers 85 and 137 to, in fact, make them function as thermoelectric heaters, rather than coolers. Accordingly, suffice to say at this time, that the present invention may be constructed to be a CCD (or other device) temperature controller, regardless of whether the ambient environment is too hot—as, for example, in powered electrical or electronic equipment—or too cold—as, for example, in artic regions, outer space, and other cold climatic or other conditions, be they natural or artificial.

In any event, whether thermoelectric coolers are constructed and assembled in combination with the apparatus associated therewith as coolers or heaters, they, in conjunction with the aforesaid heat circulating, feedback fingers 65 and 67 and the remainder of the elements combined therewith constitute a new combination of elements that produces new and improved operational results, the likes of which will now be discussed more fully below.

MODE OF OPERATION

The operation of the invention will now be discussed briefly in conjunction with both figures of the drawing.

When a charge coupled or other device to be cooled is mounted as illustrated in FIG. 1, it becomes cooled at the lower substantially central portion thereof, due to the fact that, when electrically energized, the temperature of cold junction 89 of thermoelectric cooler 85 becomes quite a bit colder than hot junction 87 thereof. Consequently, heat is withdrawn from CCD 15 in the general area that is in proximity with light sensitive apparatus (LSA) 17 (or any other device that may be substituted therefor), while LSA 17 is being exposed to whatever light (or other radiant energy, as the case may be) is passing through window 125.

The heat withdrawn from CCD 15 is conducted through thermal conductive gasket 99 and the cold junction, thermopile, and hot junction of thermoelectric cooler 85 when the invention has been designed for and is being used in the cooling mode. Then, heat-sink 59, being in thermally conductive contact with hot junction 87 via metallurgical bonding 95, absorbs a considerable amount of the heat therefrom, and, in turn, conducts it out of housing 131 toward cold junction 139 of thermoelectric cooler 137, where it is passed on through the termopile portion thereof to hot junction 141. Because said hot junction 141 is in effective contact with metal base 149 of heat exchanger 145, heat therefrom is conducted thereto and on to fins 147 thereof which, in turn, facilitate the dissipation thereof to the atmosphere (or other ambient environmental medium, as the case may be). If so desired, an air or other blower (not shown) may be employed to carry away as much heat as possible from fins 147 of heat exchanger 145, thereby tending to optimize the cooling thereof.

Thus, from the foregoing, it may readily be seen that the heat path comprising LSA 17, CCD 15, heat conductive gasket 99, theremoelectric cooler 85, metallurgical bonding 95, heat-sink 59, thermoelectric cooler 137, and heat exchanger 145 causes the efficient transfer of heat from LSA 17 to someplace else in a highly efficient manner, thereby causing the operation of CCD 15 to be vastly improved. Of course, the reverse would be true (and the heat would travel along said heat path in the direction opposite that mentioned above) if the respective junctions of thermoelectric coolers 85 and 137 were reversed. But, in such case, CCD 15 would be heated rather than cooled, as previously suggested.

In the event heat-sink 59 has to pass through an ambient environment that is, say, hotter than the CCD (or other device) to be cooled, it may be thermally isolated therefrom by means of any good conventional heat insulation 133. Hence, if heat-sink 59 would have to pass in proximity with other powered heat-producing equipment (electrical, electronic, or otherwise) in order to reach thermoelectric cooler 137 and heat exchanger 145, the addition of thermal insulation 133 thereto would certainly improve the proper and intended heat transfer characteristics thereof. Furthermore, being effectively isolated from its ambient environment—except for the light sensitive or other operative area or surface of LSA 17—by insulator 21, circuit board 13, clamps 23 and 25, and perhaps epoxy or other potting material (the latter of which is optional) also improves the cooling of said CCD 15.

In any event, because heat is removed from CCD 15 in a highly efficient manner, CCD 15 performs its function in a more efficient and desirable manner, too, even though it may range in size from exceedingly small to very large. Therefore, the performance of any device, apparatus, or equipment within which it is a component will operate better, too.

Obviously, many modifications and variations of the present invention are possible in light of the above teachings. It is, therefore, to be understood that within the scope of the appended claims the invention may be practiced otherwise than as specifically described.

What is claimed is:

1. An apparatus temperature and moisture regulator, comprising in combination:
   an apparatus whose temperature and moisture is to be regulated;
   means effectively connected to said apparatus for the effective packaging thereof in such manner as to effect the support thereof and thermally isolate it from its ambient environment;
   a heat-sink extending through one of the walls of said packaging means;
   a thermoelectric cooler having a hot junction and a cold junction, with the hot junction thereof effectively thermally connected to said heat-sink, and with the cold junction thereof effectively thermally connected to a predetermined area of said apparatus whose temperature and moisture is to be regulated; and
   means thermally coupling said heat sink to said apparatus at one or more areas more removed from the center of said apparatus than the area effectively thermally connected by said cold junction, for warming the perimeter of said apparatus to reduce condensation otherwise promoted by cooling said predetermined area.

2. A regulator of claim 1, wherein said apparatus whose temperature and moisture is to be regulated comprises a charge coupled device.

3. The regulator of claim 1, wherein said apparatus whose temperature and moisture is to be regulated comprises a solid state electronic circuit.

4. The regulator of claim 1, wherein said apparatus whose temperature and moisture is to be regulated comprises a mechanical device.

5. The regulator of claim 1, wherein said apparatus whose temperature and moisture is to be regulated comprises a transistor.

6. The regulator of claim 1, wherein said apparatus whose temperature and moisture is to be regulated is an electrical apparatus.

7. The regulator of claim 1, wherein said apparatus whose temperature and moisture is to be regulated is an integrated, electronic apparatus.

8. The regulator of claim 1, wherein said means effectively connected to said apparatus for the effective packaging thereof in such manner as to effect the support thereof and thermally isolate it from its ambient environment comprises:
   a cup-shaped insulator having a plurality of substantially parallel walls and a wall interconnecting said parallel walls at one of the ends of each thereof, with the other ends of said substantially parallel walls having surfaces upon which said apparatus is mounted;

a printed circuit board disposed in contact with one of the surfaces of the aforesaid interconnecting wall of the aforesaid cup-shaped insulator; and a pair of clamps connected to said printed circuit board and a predetermined surface of said apparatus in such manner as to hold said apparatus against a portion of the end surfaces of the respective other ends of the substantially parallel walls of said cup-shaped insulator.

9. The regulator of claim 1, wherein said heat-sink is a metallic bar that is disposed in effective contact with and between a surface of the hot junction of said thermoelectric cooler and an inside surface of said packaging means.

10. The regulator of claim 1, further characterized by a resilient means effectively connected between predetermined surfaces of said heat-sink and said packaging means for the urging of said thermoelectric cooler toward a predetermined portion of the aforesaid apparatus whose temperature and moisture is to be regulated.

11. The regulator of claim 1, wherein said thermally coupling means is further characterized by a plurality of resilient heat-conductive fingers effectively connected between said heat-sink and predetermined areas of said apparatus whose temperature and moisture is to be regulated.

12. The regulator of claim 1, further characterized by means connected to the end of said heat-sink that is opposite the end thereof that extends through the wall of said packaging means for conducting heat therefrom.

13. The regulator of claim 1, further characterized by:

a thermoelectric cooler having a cold junction and a hot junction, and a thermopile therebetween, with the cold junction effectively thermally connected to said heat-sink; and a heat exchanger effectively thermally connected to the hot junction of said thermoelectric cooler.

14. The regulator of claim 13, wherein said heat exchanger effectively thermally connected to the hot junction of said thermoelectric cooler comprises:

a metal base connected to the hot junction of said thermoelectric cooler; and a plurality of metal air-cooling fins connected to said metal base.

15. A charge coupled device cooling system, comprising in combination:

a charge coupled device cooling sub-system;

a heat-sink effectively connected to the thermal output of said charge coupled device cooling subsystem for conducting heat therefrom;

a thermoelectric cooler having a hot junction, a cold junction, and a predetermined thermocouple therebetween, with the cold junction thereof effectively connected to said heat-sink for heat conduction therebetween;

means effectively thermally connected to the hot junction of said thermoelectric cooler for withdrawing heat therefrom; and means thermally coupling said heat sink to at least one area of the charge coupled device being cooled which is removed from the portion of said device whereat heat is generated by operating said device, for warming the perimeter of said device to reduce condensation otherwise promoted by the cooling.

16. The device of claim 15, wherein said charge coupled cooling subsystem comprises:

a heat-conductive gasket thermally connected to a predetermined area of the charge coupled device to be cooled;

a thermoelectric cooler having a hot junction, a cold junction, and a predetermined thermocouple therebetween, with the cold junction thereof effectively connected to said heat-conductive gasket, and with the hot junction thereof effectively connected to the aforesaid heat-sink; and wherein said warming means comprises a plurality of resilient, heat-conducting, thermal-feedback fingers effectively connected between said heat-sink and the aforesaid charge coupled device at locations thereon that are spatially disposed predetermined distances from the predetermined area to which said gasket is thermally connected 17. The device of claim 15, wherein said means effectively thermally connected to the hot junction of said thermoelectric cooler for withdrawing heat therefrom comprises a predetermined heat exchanger.

18. The device of claim 15, wherein said means effectively thermally connected to the hot junction of said thermoelectric cooler for withdrawing heat therefrom comprises:

a metal base; and metal fins connected to and extending from said metal base.

19. The system of claim 15, further characterized by thermal insulation disposed around a predetermined portion of said heat-sink 20. The system of claim 15, further characterized by:

means for housing said charge coupled device cooling subsystem; and means connected to said housing means for the predetermined support thereof.

21. The device of claim 20, wherein said means connected to said housing means for the predetermined support thereof comprises a printed circuit board.

22. A charge coupled device temperature and moisture regulator, comprising in combination:

a substantially cup-shaped, elongated insulator having a plurality of substantially parallel side walls that are interconnected at one of the ends of each thereof by a cross-wall, thereby leaving an open space therebetween;

a charge coupled device mounted on the other ends of the parallel walls of said substantially cup-shaped, elongated insulator in such manner as to bridge the gap therebetween;

an elongated heat-sink disposed in contact with the inside surface of the aforesaid cross-wall and extending through one of said parallel side walls;

a plurality of metal fingers bonded to the sides of said elongated heat-sink and resiliently urged into contact with predetermined areas of the aforesaid charge coupled device;

a first thermoelectric cooler having hot and cold junctions, with one of the junctions thereof thermally connected to a predetermined area of said charge coupled device, and with the other of the junctions thereof thermally connected to a predetermined area of the aforesaid elongated heat-sink;

potting means filling the space within said cup-shaped insulator not occupied by the aforesaid heat-sink, first thermoelectric cooler, and plurality of metal fingers;

a second thermoelectric cooler having hot and cold junctions and a thermopile therebetween, with one of the junctions thereof thermally connected to said heat-sink;

heat exchanger means thermally connected to the other junction of said second thermoelectric cooler; and power supply means connected to said first and second thermoelectric coolers in such manner as to effect the timely electrical energization thereof.

23. The regulator of claim 22, wherein said substantially cup-shaped, elongated insulator is a plastic insulator.

24. The regulator of claim 23, wherein said charge coupled device is an integrated circuit, semiconductor.

25. The regulator of claim 22, wherein said one junction of said first thermoelectric cooler that is thermally connected to a predetermined area of said charge coupled device is a hot junction, and the other junction thereof that is thermally connected to a predetermined area of the aforesaid heat-sink is a cold junction.

26. The regulator of claim 22, wherein said one junction of said second thermoelectric cooler that is thermally connected to said heat-sink is a hot junction, and the other junction thereof that is thermally connected to said heat exchanger is a cold junction.

27. The regulator of claim 22, wherein said one junction of said first thermoelectric cooler that is thermally connected to a predetermined area of said charge coupled device is a cold junction, and the other junction thereof that is thermally connected to a predetermined area of the aforesaid heat-sink is a hot junction.

28. The regulator of claim 22, wherein said one junction of said second thermoelectric cooler that is thermally connected to said heat-sink is a cold junction, and the other junction thereof that is thermally connected to said heat exchanger is a hot junction.

29. The regulator of claim 22, wherein said heat exchanger means comprises:

a heat-conducting metal base connected to the other junction of said second thermoelectric cooler; and a plurality of air-cooled fins connected to said heat-conducting metal base.

30. The regulator of claim 22, wherein said power supply means connected to said first and second thermoelectric coolers in such manner as to effect the timely electrical energization thereof comprises a direct current voltage power supply.

31. An apparatus temperature and moisture regulator, comprising in combination:

an apparatus whose temperature and moisture is to be regulated;

means effectively connected to said apparatus for the effective packaging thereof in such manner as to effect the support thereof and thermally isolate it from its ambient environment;

a heat-sink extending through one of the walls of said packaging means; and a thermoelectric cooler enclosed by said packaging means and apparatus, having a hot junction and a cold junction, with the hot junction thereof effectively thermally connected to said heat-sink, and with the cold junction thereof effectively thermally connected to a predetermined area of said apparatus whose temperature and moisture is to be regulated.

32. Apparatus whereby a charge coupled device is both heated and cooled to control its operating temperature and prevent condensation which might otherwise result from the cooling, comprising:

a housing for supporting the charge coupled device and providing an enclosure;

a heat sink transgressing the enclosure of said housing;

a thermoelectric cooler that has a heat exchanger of interdigitized fingers which are enclosed within said housing by said housing and said device, having a hot junction and a cold junction, with the hot junction thermally coupled to said heat sink and the cold junction thermally coupled to the light sensitive area of said device; and means thermally coupling said heat sink to said device in such a manner as to conduct heat from said heat sink to the relatively inactive area(s) of said device in order to discourage the accumulation of condensation.

* * * * *